United States Patent
Lo et al.

(10) Patent No.: US 10,101,047 B2
(45) Date of Patent: Oct. 16, 2018

(54) GAS PURIFIER FOR WAFER SUBSTRATE ACCOMMODATING UNIT

(71) Applicant: GUDENG PRECISION INDUSTRIAL CO, LTD., New Taipei (TW)

(72) Inventors: Ming-Mo Lo, Hsinchu County (TW); Cheng-Hsin Chen, Changhua County (TW); Tien-Jui Lin, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 1186 days.

(21) Appl. No.: 13/834,796

(22) Filed: Mar. 15, 2013

(65) Prior Publication Data

US 2014/0194050 A1 Jul. 10, 2014

(30) Foreign Application Priority Data

Jan. 7, 2013 (TW) .............................. 102200298 U (51) Int. Cl.
 *F24F 7/04* (2006.01)
 *H01L 21/673* (2006.01)

(52) U.S. Cl.
 CPC .......... *F24F 7/04* (2013.01); *H01L 21/67393* (2013.01)

(58) Field of Classification Search
 CPC ......... H01L 21/67393; F24F 7/04; F24F 7/10; F24F 13/12; F24F 13/075; B05B 1/1672; B05B 1/326

USPC ..... 454/370; 138/113, 92, 43; 406/158, 160, 406/164, 167; 137/616.5; 239/416, 239/424.5, 438; 222/482

See application file for complete search history.

(56) References Cited

U.S. PATENT DOCUMENTS

| 3,724,760 A * | 4/1973 | Smith ................. B05B 1/1672 239/282 |
| 4,745,088 A * | 5/1988 | Inoue ................. C23C 16/4584 117/101 |
| 5,690,552 A * | 11/1997 | Siddle ................. F41B 15/025 135/75 |

(Continued)

FOREIGN PATENT DOCUMENTS

| DE | 10240324 A1 * | 3/2004 | .......... B05B 1/1663 |
| TW | M347664 | 12/2008 | |

*Primary Examiner* — Steven B McAllister
*Assistant Examiner* — Steven Anderson, II
(74) *Attorney, Agent, or Firm* — Li & Cai Intellectual Property (USA) Office (57) ABSTRACT

A gas purifier to be applied on a wafer substrate accommodating unit with an inlet hole includes an outer tube and an inner tube. The outer tube is disposed on the wafer substrate accommodating unit and has a plurality of first gas filling apertures. One end of the inner tube is a closed end and the other end is an open end. The inner tube has a plurality of second gas filling apertures, and its open end is interconnected with the inlet hole. The inner tube is movably disposed within the outer tube between a first operating position and second operating position. The second gas filling apertures are correspondingly configured to an inner wall of the outer tube when the inner tube is at a first operating position, and interconnected with the first gas filling apertures when the inner tube is at a second operating position.

10 Claims, 7 Drawing Sheets

(56) References Cited

U.S. PATENT DOCUMENTS

| | | | | |
|---|---|---|---|---|
| 5,765,581 A | * | 6/1998 | Badger | B05B 1/16 |
| | | | | 134/198 |
| 6,158,089 A | * | 12/2000 | Monahan | B25G 1/04 |
| | | | | 16/405 |
| 6,622,947 B1 | * | 9/2003 | Rivera | B05B 1/1672 |
| | | | | 239/391 |
| 8,783,463 B2 | * | 7/2014 | Watson | H01L 21/67393 |
| | | | | 206/454 |
| 8,895,356 B2 | * | 11/2014 | Maeng | C23C 16/45502 |
| | | | | 118/728 |

* cited by examiner

GAS PURIFIER FOR WAFER SUBSTRATE ACCOMMODATING UNIT

BACKGROUND OF THE INVENTION

1. Field of the Invention

The present invention relates to a gas purifier; in particular, to a device which provides clean gas to a wafer substrate accommodating unit.

2. Description of Related Art

Wafers are high-precision products and its storage solution demands specific conditions. For example, the gas in the storage space needs to be particle free to reduce contamination on the wafers which leads to a compromise in wafer precision. Also, the gas in the storage space cannot have water vapor or oxygen, preventing chemical reactions such as oxidation on the surface of the wafers. Therefore, replenishing the interiors of wafer accommodating units with clean gas of consistent quality is an important task in the manufacturing and transporting processes of wafers.

Publication TW M347664 discloses a prior art for solving the above problem. The disclosure includes an improved gas purifier for a Front Opening Unified Pod which fills the Front Opening Unified Pod (FOUP) with clean gas of consistent quality through the inlet of the FOUP such that the clean and consistent gas is mixed with the gas within the FOUP and then discharged through the outlet of the FOUP. As a result, the particle, oxygen and water vapor concentrations of the gas within the FOUP are significantly reduced. The disclosure also uses a tube with apertures for evenly distributing the filling within the FOUP.

However a persisting problem of the above disclosure is that when gas is not being filled into the FOUP, the gas within nonetheless flows into the tube with apertures and possibly further out of the inlet of the gas purifier, potentially contaminating the source of the clean and consistent gas.

Hence, the present inventor believes the above mentioned disadvantages can be overcome, and through devoted research combined with application of theory, finally proposes the present disclosure which has a reasonable design and effectively improves upon the above mentioned disadvantages.

SUMMARY OF THE INVENTION

The object of the present disclosure is to provide an gas purifier which has an open state and a closed state. Namely, the gas purifier can be at an open or closed state such that when the gas purifier is not filling in gas, it can be at a close state to reduce backflow of gas.

In order to achieve the aforementioned objects, the present disclosure provides an gas purifier positioned within a wafer substrate accommodating unit. The wafer substrate accommodating unit has an inlet. The gas purifier includes an outer tube and an inner tube. The outer tube is disposed on the wafer substrate accommodating unit, and has a plurality of first gas filling apertures. The inner tube is open ended at one end and close ended at the other end. The inner tube has a plurality of second gas filling apertures. The open end of the inner tube is aligned with the inlet. The inner tube is movably disposed within the outer tube between a first operating position and a second operating position. When the inner tube is at the first operating position, the second gas filling apertures are aligned with the inner wall of the outer tube. When the inner tube is at the second operating position, the second gas filling apertures are aligned with the first gas filling apertures.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
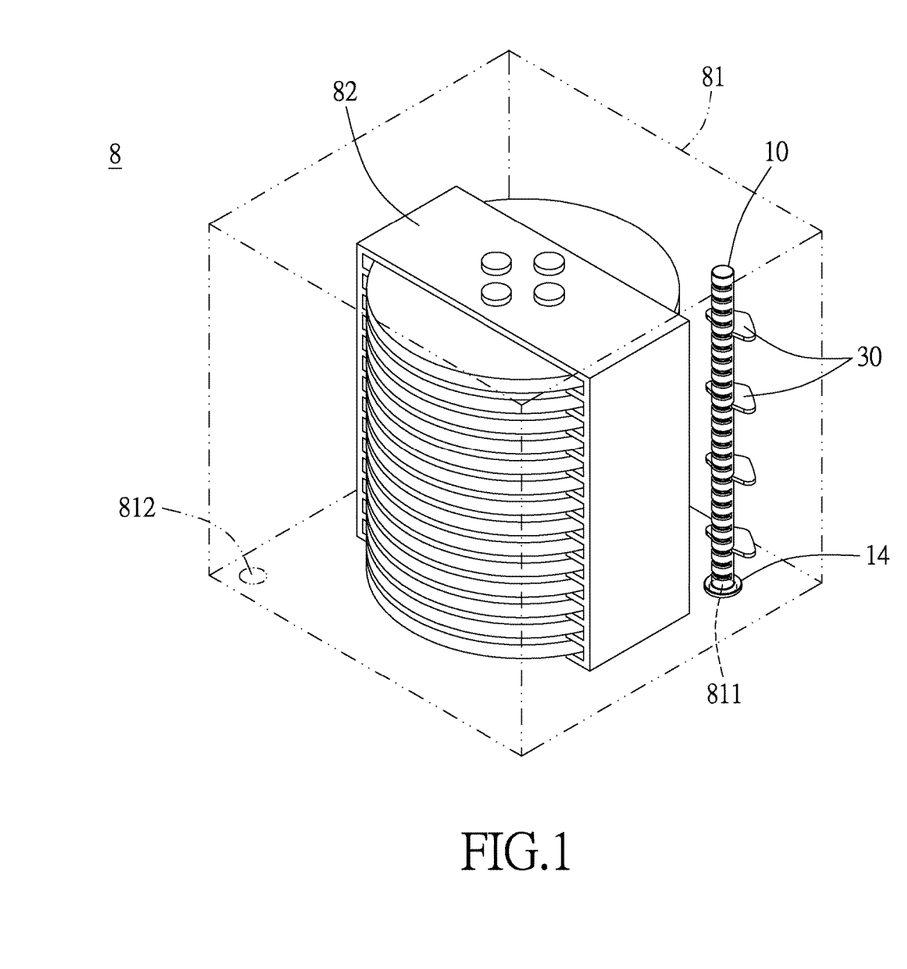
FIG. 1 shows a diagram of an gas purifier illustrating the operation mode of an gas purifier and a wafer substrate accommodating unit of the present disclosure.

FIG. 1 shows a diagram of an gas purifier illustrating the operation mode of an gas purifier 1 and a wafer substrate accommodating unit 8 of the present disclosure. Referring to FIG. 1, the wafer substrate accommodating unit 8 includes a case 81 and a wafer storage rack 82. The case 81 has an inlet 811 and an outlet 812. Inert gas or nitrogen which is less prone to being oxidized is introduced through the inlet 811 into the case 81. The gas within the case 81 is discharged through the outlet 812. A check valve (not shown in the figure) can be disposed at the outlet 812 to prevent gas outside of case 81 from flowing into the case 81.

Replacing the existing gas with inert gas accomplishes the object of keeping the substrate (such as wafer) within the wafer substrate accommodating unit 8 in a consistent and clean state, because the existing gas within the case 81 can be contaminated with particles and mixed with oxygen and water vapor. The wafer substrate accommodating unit 8 can be a Front Opening Unified Pod (FOUP) or a wafer furnace, and is not limited in the present disclosure. The wafer substrate accommodating unit 8 further includes an gas purifier 1 (as shown in FIG. 2) disposed within the case 81.

Figure 2:
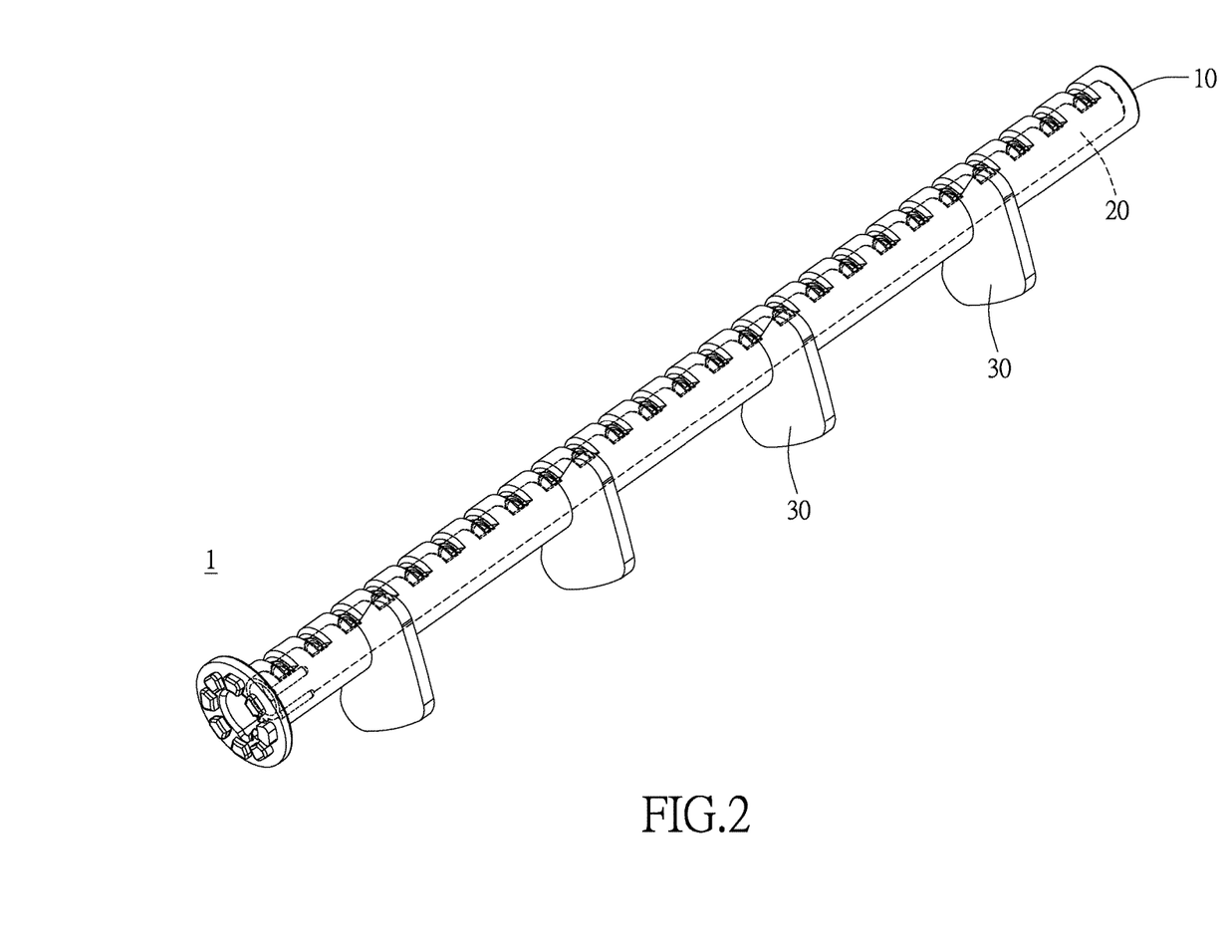
FIG. 2 shows a diagram of an assembled gas purifier of the present disclosure.

FIG. 2 shows an assembly diagram of a gas purifier 1 of the present disclosure. Referring to FIG. 2, the gas purifier 1 includes an outer tube 10, an inner tube 20, and a fixing board 30. The inner tube 20 and the outer tube 10 are circular cylinders, each with a definable axis. The inner tube 20 is disposed within the outer tube 10. The fixing board 30 connects the outer tube 10 to the case 81 (as shown in FIG. 1).

Figure 3:
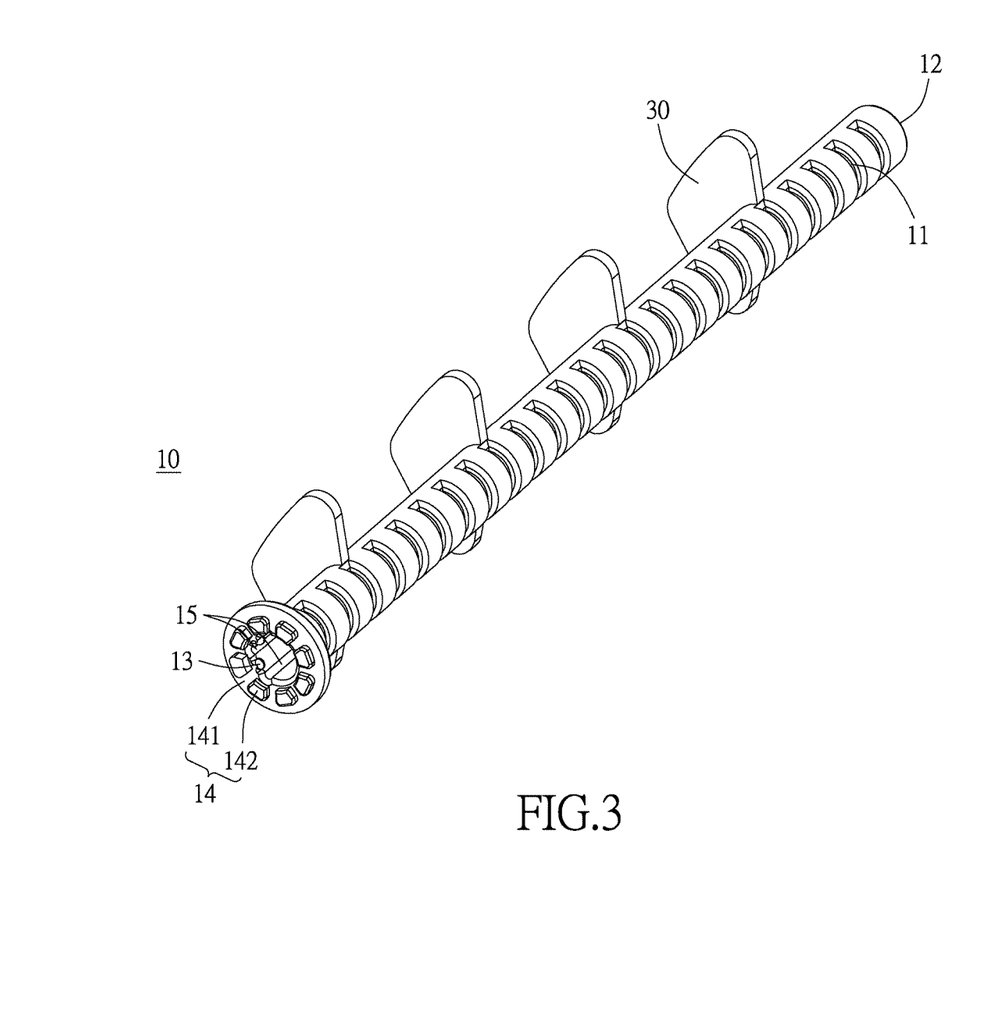
FIG. 3 shows a schematic diagram of an outer tube of an gas purifier of the present disclosure.
Figure 6:
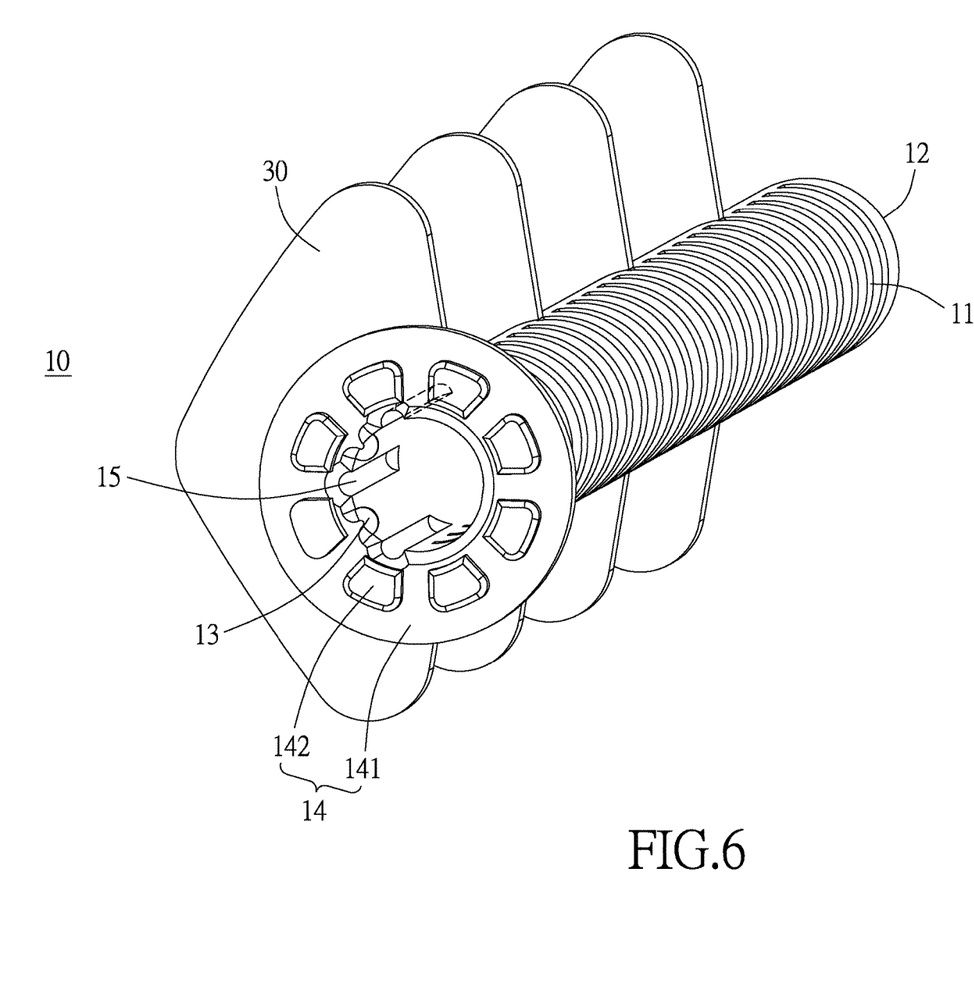
FIG. 6 shows a detailed schematic diagram of an outer tube of an gas purifier of the present disclosure.

FIG. 3 shows a schematic diagram of an outer tube 10 of an gas purifier 1 of the present disclosure. Referring to FIG. 3, the outer tube 10 includes a plurality of first gas filling apertures 11. One end of the outer tube 10 is disposed on the case 81 of the wafer substrate accommodating unit 8 (as shown in FIG. 1) by screwing, coupling or other methods of fixture. The other end of the outer tube 10 is a closed end 12. FIG. 6 shows a detailed schematic diagram of an outer tube 10 of an gas purifier of the present disclosure. Referring to FIG. 3 and FIG. 6, in the present embodiment, the outer tube 10 further includes a fixing portion 14 which has an annular plate 141 and a plurality of coupling protrusions 142 disposed on the annular plate 141. The case 81 has a plurality of coupling grooves (not shown in the figure) for engaging with the coupling protrusions 142, such that the annular plate 141 can tightly fit on the case 81 so as to prevent gas from leaking into the case 81 through the connection between the outer tube 10 and the case 81. The inner surface of the outer tube 10 has at least one restricting portion 13 and at least one positioning groove 15.

Figure 4:
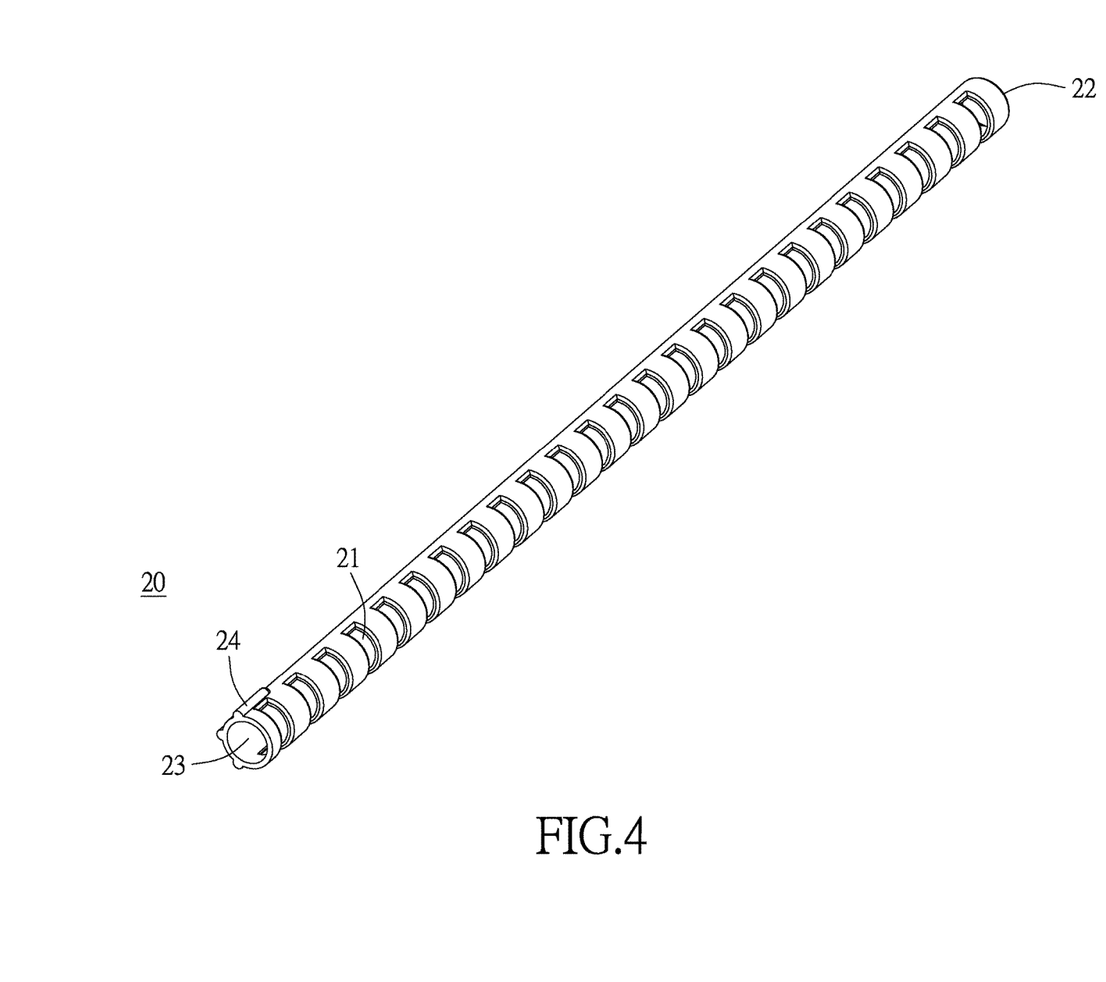
FIG. 4 shows a schematic diagram of an inner tube of an gas purifier 1 of the present disclosure.

FIG. 4 shows a schematic diagram of an inner tube 20 of an gas purifier 1 of the present disclosure. Referring to FIG. 4, the inner tube 20 includes a plurality of second gas filling apertures 21. One end of the inner tube 20 is a closed end 22 and the other end is an open end 23. The closed end 22 of the inner tube 20 corresponds to the closed end 12 of the outer tube 10. The open end 23 of the inner tube 20 is aligned with the inlet 811, such that the gas entering through the inlet 811 can fill the inner tube 20. In the present embodiment, the inner tube 20 further includes at least one protruding portion 24. The protruding portion 24 is proximal to the open end 23 and corresponds to the positioning groove 15.

Figure 5:
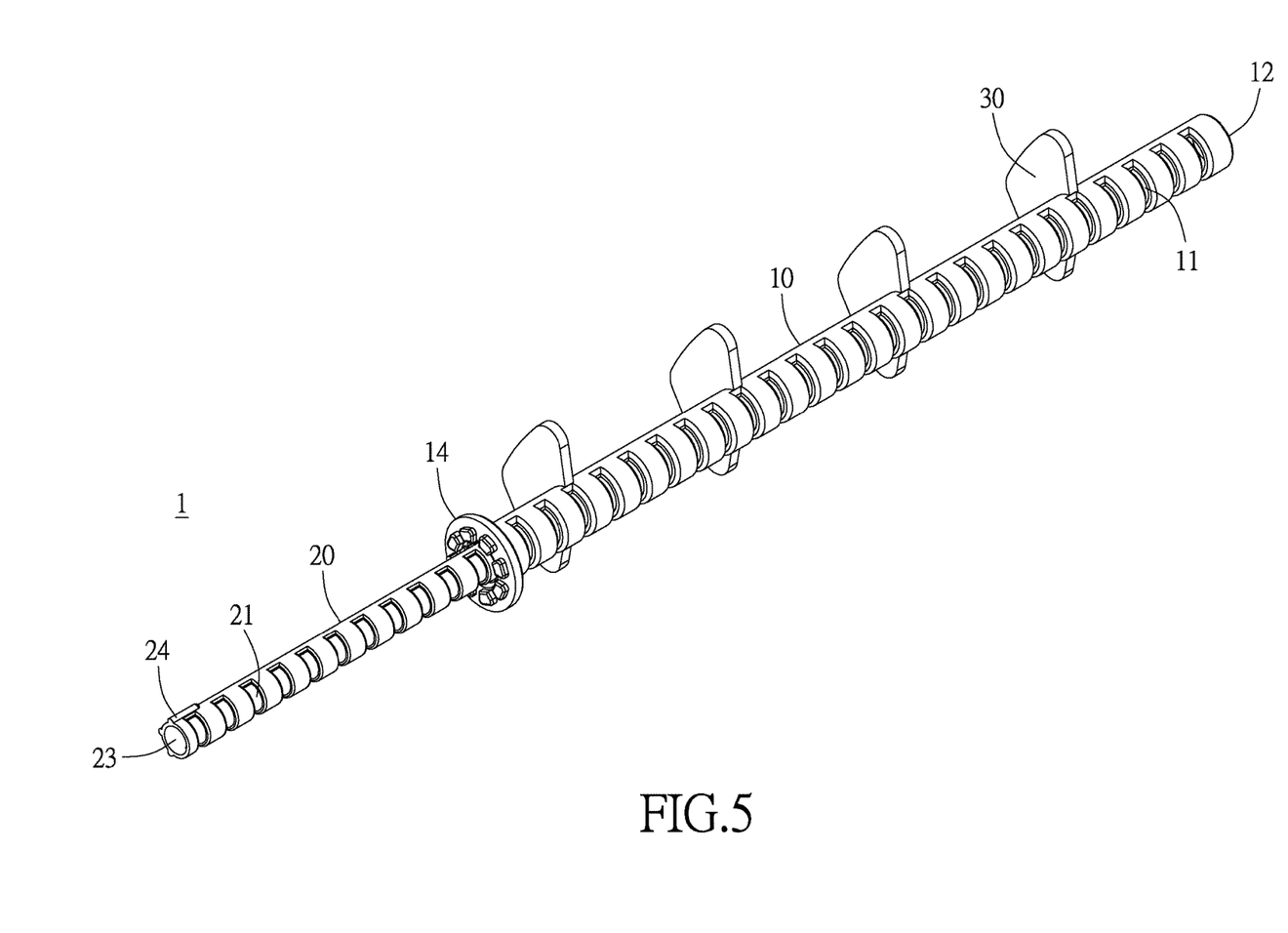
FIG. 5 shows an assembly diagram of an gas purifier of the present disclosure.
Figure 7A:
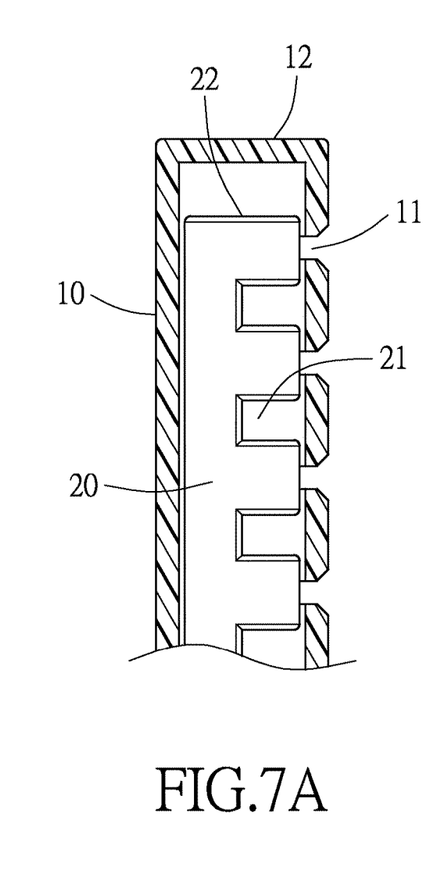
FIG. 7A shows an operation schematic diagram of an gas purifier of the present disclosure.
Figure 7B:
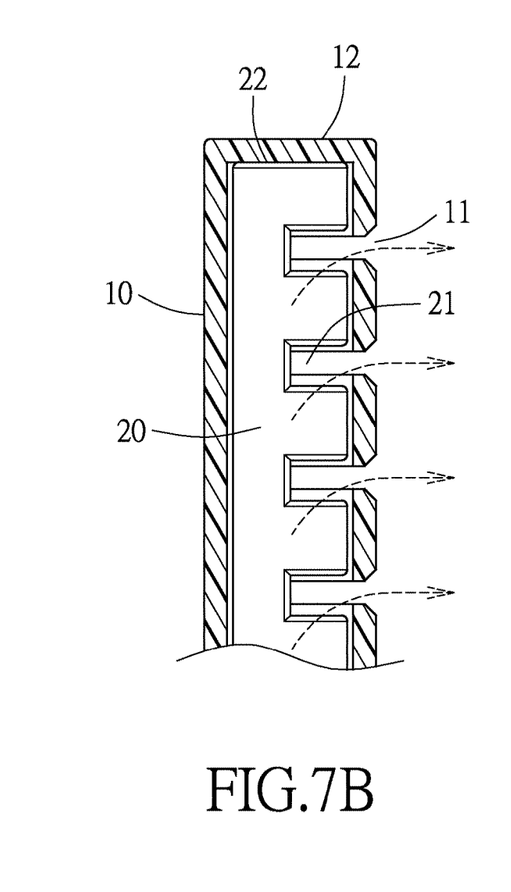
FIG. 7B shows an operation schematic diagram of an gas purifier of the present disclosure.

FIG. 5 shows an assembly diagram of an gas purifier 1 of the present disclosure. FIG. 7A and FIG. 7B show a schematic operation diagram of an gas purifier 1 of the present disclosure. Referring to FIG. 5, FIG. 7A and FIG. 7B, the inner tube 20 is movably disposed within the outer tube 10. The inner tube 20 has two operating positions which are distinct positions relative to the outer tube 10. The two operating positions are a first operating position and a second operating position and correspond respectively to the closed and open states of the gas purifier 1. The inner tube 20 can move between the first operating position and the second operating position. The direction of motion of the inner tube 20 is along the axial direction of the circular tubes.

As shown in FIG. 1 and FIG. 7A, when the inner tube 20 is positioned at the first operating position, which is when the gas purifier 1 is at a closed state, the second gas filling apertures 21 of the inner tube 20 align with the inner wall of the outer tube 10 such that the gas within the inner tube 20 cannot flow to the outer tube 10. Namely, the gas cannot flow into the case 81. Likewise, the gas within the case 81 cannot flow into the inner tube 20 such that gas for filling is kept as clean inert gas. The open end 23 of the inner tube 20 abuts the restricting portion 13 (as shown in FIG. 2) such that the inner tube 20 can be kept from falling due to gravity.

As shown in FIG. 1 and FIG. 7B, when the inner tube 20 is positioned at the second operating position, which is when the gas purifier 1 is at an open state, the second gas filling apertures 21 of the inner tube 20 align with the first gas filling apertures 11 of the outer tube 10 such that the gas flowing through the inlet 811 into the inner tube 20 can flow into the case 81 through the second gas filling apertures 21 and the first gas filling apertures 11.

In an embodiment of the present disclosure, the inner tube 20 is raised to the second operating position by the gas pressure acting on the top end 22 of the inner tube 20 when gas enters from the inlet 811. This configuration ensures that the inner tube 20 is positioned at the first operating position corresponding to a closed state of the gas purifier 1 when no gas is being filled in. This configuration also ensures that the inner tube 20 is positioned at the second operating position only when gas is flowed within the inner tube 20 from the open end 23 to the closed end 22. In other words, when the gas purifier 1 is at an open state, the gas being filled in is evenly flowed into the case 81 through the second gas filling apertures 21 and the first gas filling apertures 11.

In an embodiment of the present disclosure, when the inner tube 20 is positioned at the second operating position, the closed end 22 of the inner tube 20 abuts the closed end 12 of the outer tube 10 such that the inner tube 20 does not move out of the intended range, even out of the outer tube 10. Namely, the closed end 12 of the outer tube 10 can restrict the movement of the inner tube within the intended range.

In an embodiment of the present disclosure, the width of the second gas filling apertures 21 is larger than the width of the first gas filling apertures 11. This configuration requires less precision on the movement of the inner tube 20 for aligning the second gas filling apertures 11 to the first gas filling apertures 21. Namely, the inner tube 20 does not have to move completely to the second operating position for the inert gas flowed from the inlet 811 into the inner tube 20 to further flow through the second gas filling apertures 21, the first gas filling apertures 11 and into the case 81.

In an embodiment of the present disclosure, the protruding portion 24 of the inner tube 20 is slidably disposed on the positioning groove 15 of the outer tube 10 to restrict movement in the axial direction of the inner tube 20 as it moves along the axial direction. Thusly, the outer surface of the inner tube 20 is prevented from contacting the inner surface of the outer tube 10 and creating friction. The configuration of the positioning groove 15 and the protruding portion 24 also prevents the inner tube 20 from rotating about the axial direction. Such a rotation of the inner tube 20 prevents the second gas filling apertures 21 from aligning with the first gas filling apertures 11 even when the inner tube 20 is at the second operating position.

As shown in FIG. 1 and FIG. 2, one side of the fixing board 30 connects to the case 81 of the wafer substrate accommodating unit 8. The other side of the fixing board 30 connects to the outer surface of the outer tube 10 such that the outer tube 10 can be securely disposed within the case 81. In the present embodiment, the fixing board 30 is a board substantially having the shape of an isosceles triangle, whose base side (longer side) is disposed on the outer surface of the outer tube 10 and whose vertex angle is disposed on a corner of the case 81, such that the outer tube 10 does not easily shake and the inner tube 20 does not move to cause deformation in the radial direction.

In summary, the present disclosure provides the configuration of the outer tube and the inner tube which creates an open state and a closed state for the gas supplier. Also, one end of the inner tube is a closed end, such that the inner tube can move from the first operating position to the second operating position by the pressure applied by the gas being filled in. Moreover, the present disclosure provides the configuration of the positioning groove and the protruding portion prevents movement of the inner tube other than translational motion in the axial direction. Further, the width of the second gas filling apertures is larger than the width of the first gas filling apertures, so that less precision is required of the movement of the inner tube with respect to operating positions.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A gas supplying device of a wafer substrate accommodating unit, wherein the wafer substrate accommodating unit includes an inlet hole, the gas supplying device comprising:
   an outer tube disposed on the wafer substrate accommodating unit; wherein the outer tube has a first open end, a first closed end opposite to the first open end, a plurality of first gas filling apertures, a restricting portion protruded from an inner surface thereof adjacent to the first open end, and at least one positioning groove longitudinally formed on an inner surface of the outer tube, the at least one positioning groove having an opening end coplanar with the first open end of the outer tube; and
   an inner tube having a second closed end, a second open end, at least one longitudinally protruding portion protruded formed on an outer surface thereof and has an end coplanar with the second open end of the inner tube, and a plurality of second gas filling apertures, wherein the second open end is interconnected with the inlet hole;
   wherein the inner tube is movably disposed in the outer tube between a first operating position and a second operating position, the second gas filling apertures are aligned with an inner wall of the outer tube when the inner tube is at the first operating position, and the second gas filling apertures are interconnected with the first gas filling apertures when the inner tube is at the second operating position,
   wherein the at least one longitudinally protruding portion of the inner tube is movably disposed in one of the positioning grooves of the outer tube;
   wherein the restricting portion of the outer tube blocks the open end of the inner tube so as to restrict the inner tube from moving out of the outer tube at the first operating position.

2. The gas supplying device according to claim 1, further comprising at least one fixing board disposed on the outer surface of the outer tube, so as to connect the outer tube to the wafer substrate accommodating unit.

3. The gas supplying device according to claim 1, wherein the second closed end of the inner tube abuts the first closed end of the outer tube when the inner tube is at the second operating position.

4. The gas supplying device according to claim 1, wherein the outer tube has a fixing portion, the fixing portion comprises an annular plate connected to the first open end perpendicular to the inner wall of the outer tube, and a plurality of coupling protrusions disposed on a bottom surface of the annular plate, thereby the fixing portion is able to tightly fit on the wafer substrate accommodating unit.

5. The gas supplying device according to claim 1, wherein the width of the first gas filling apertures is smaller than the width of the second gas filling apertures.

6. A wafer substrate accommodating unit, comprising:
   a case having an inlet hole and an outlet hole;
   a wafer storage rack disposed within the case; and
   an gas supplying device disposed within the case, comprising:
      an outer tube disposed on the wafer substrate accommodating unit wherein the outer tube has a first open end, a first closed end opposite to the first open end, a plurality of first gas filling apertures, a restricting portion protruded from an inner surface thereof adjacent to the first open end, and at least one positioning groove longitudinally formed on an inner surface of the outer tube, the at least one positioning groove having an opening end coplanar with the first open end of the outer tube; and
      an inner tube disposed in the outer tube and having a second closed end, a second open end, at least one longitudinally protruding portion protruded formed on an outer surface thereof and has an end coplanar with the second open end of the inner tube, and a plurality of second gas filling apertures, wherein the second open end is interconnected with the inlet hole;
   wherein the inner tube is correspondingly configured to a first operating position and a second operating position in the outer tube and moves there-between, the second gas filling apertures are aligned with an inner wall of the outer tube when the inner tube is at a first operating position, and the second gas filling apertures are interconnected with the first gas filling apertures when the inner tube is at a second operating position;
   wherein the at least one longitudinally protruding portion of the inner tube is movably disposed in one of the positioning grooves of the outer tube;
   wherein the restricting portion of the outer tube blocks the open end of the inner tube so as to restrict the inner tube in from moving out of the outer tube at the first operating position.

7. The wafer substrate accommodating unit according to claim 6, further comprising at least one fixing board disposed on the outer surface of the outer tube, so as to connect the outer tube to the case of the wafer substrate accommodating unit.

8. The wafer substrate accommodating unit according to claim 6, wherein the second closed end of the inner tube abuts the first closed end of the outer tube when the inner tube is at the second operating position.

9. The wafer substrate accommodating unit according to claim 6, wherein the outer tube has a fixing portion, the fixing portion comprises an annular plate connected to the first open end perpendicular to the inner wall of the outer tube, and a plurality of coupling protrusions disposed on a bottom surface of the annular plate, thereby the fixing portion is able to tightly fit on the case of the wafer substrate accommodating unit.

10. The wafer substrate accommodating unit according to claim 6, wherein the width of the first gas filling apertures is smaller than the width of the second gas filling apertures.

* * * * *